United States Patent [19]

Shibayama et al.

[11] 4,349,409
[45] Sep. 14, 1982

[54] METHOD AND APPARATUS FOR PLASMA ETCHING

[75] Inventors: Hikou Shibayama; Tetsuya Ogawa, both of Machida; Makoto Kosugi, Yokohama; Tokushige Hisatsugu, Chofu; Koichi Kobayashi, Yokohama, all of Japan

[73] Assignee: Fujitsu Limited, Kawasaki, Japan

[21] Appl. No.: 262,793

[22] Filed: May 11, 1981

[30] Foreign Application Priority Data

May 12, 1980 [JP] Japan .................................. 55-62427
May 13, 1980 [JP] Japan .................................. 55-62992

[51] Int. Cl.$^3$ ...................... H01L 21/302; B44C 1/22; C03C 15/00; C03C 25/06
[52] U.S. Cl. ................................... 156/643; 156/345; 156/646; 156/653; 204/192 E; 204/298
[58] Field of Search ............... 156/643, 646, 650–653, 156/345, 657; 204/164, 192 E, 298; 250/531; 252/79.1

[56] References Cited

U.S. PATENT DOCUMENTS 4,174,251 11/1979 Paschke .......................... 156/646 X
4,233,109 11/1980 Nishizawa ..................... 156/646 X

FOREIGN PATENT DOCUMENTS 55-38043 3/1980 Japan.

Patent Abstracts of Japan, Vol. 4, No. 71, May 24, 1980, P. 10E 12, Dry Etching Device, Appl. No. 53-111257, Fu, Itsu K. K. Kouichi Kobayashi.
Journal of the Electrochemical Society, Vol. 126, No. 6, June 1979, Pages 1024–1028, The Roles of Ions and Neutrak Active Species in Microwark Plasma etching, Suzuki et al.
Ion beam etching, Harper et al, Abstract No. 284.
Journal of the Electrochemical Society, Vol. 80-1, May 1980, Pages 716–717, how Energy Ion beam etching, Harper et al.

*Primary Examiner*—William A. Powell
*Attorney, Agent, or Firm*—Staas & Halsey

[57] ABSTRACT

A method and an apparatus for plasma etching semiconductor materials by providing an intermediate electrode between the electrodes in a parallel state type plasma etching apparatus, moving the intermediate electrode by a drive mechanism, and continuously changing from a condition of high input power and high self-bias voltage to a condition of low input power and low self-bias voltage while varying the distance between the intermediate electrode and the first electrode and the RF power, thereby to remove damage or deposits that may have been formed on the surface when the semiconductor material was being subjected to processing.

18 Claims, 32 Drawing Figures

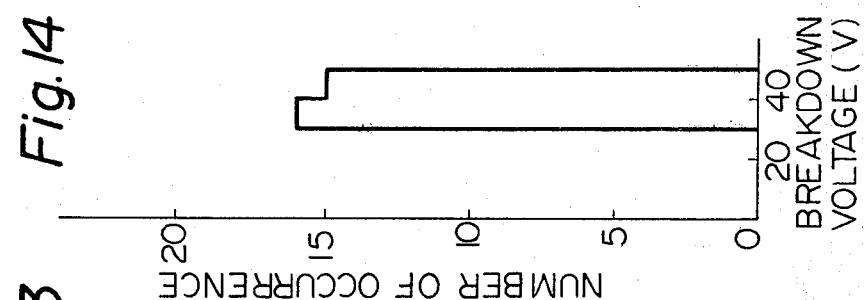
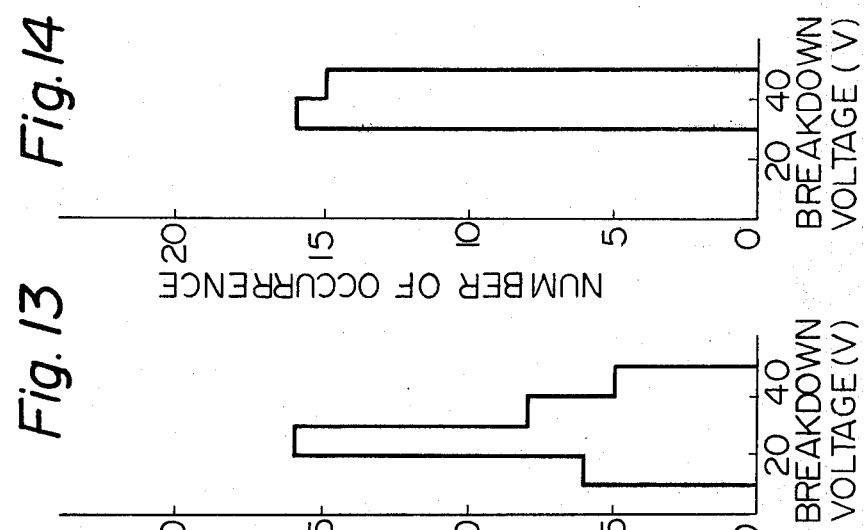
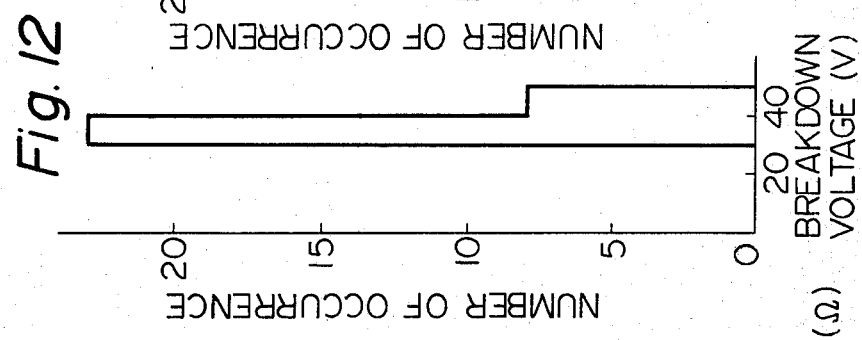
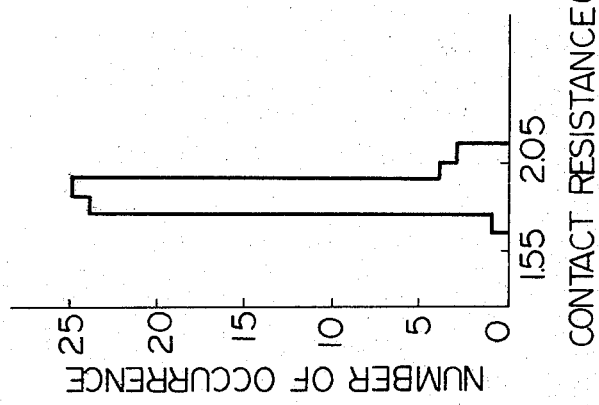

METHOD AND APPARATUS FOR PLASMA ETCHING

BACKGROUND OF THE INVENTION

1. Field of the Invention

The present invention relates to a method for effecting plasma etching for semiconductor materials and an apparatus therefor. The method and apparatus according to the present invention can be used for the production of, for example, MOS type semiconductor integrated circuits.

2. Description of the Prior Art

In a parallel plate type plasma etching apparatus, semiconductor elements are usually processed using a relatively high electric power of a high frequency in order to attain fast etching speeds and good pattern edge profiles. Due to a capacitor in this case, a self-bias voltage is generated on a first electrode (for example, a cathode) on which is mounted a specimen of a semiconductor material that is to be processed. Owing to this bias voltage, ions in the plasma are accelerated and impinge upon the specimen that is to be processed; i.e., products having excellent pattern edge profiles are obtained. However, bombardment of high-energy ions often damages the specimens that are to be processed. The extent of the damage, usually, depends upon the accelerating energy. From the standpoint of achieving processing of a specimen without damage, therefore, it is desired to employ ions with a low accelerating energy. Use of ions with a low accelerating energy, however, inevitably results in a decrease of the etching speed. To overcome this and to achieve the processing without any damage but with fast etching speed. There has been proposed a particular device wherein, an intermediate electrode, which serves as a third electrode, is provided in a generally employed two electrode type plasma etching apparatus.

FIG. 1 illustrates a conventional apparatus for effecting plasma etching, having an intermediate electrode. Referring to FIG. 1, the apparatus consists of a first electrode 1, a second electrode 2, a bell jar 3, a capacitor 5, a high frequency power supply 6, and an intermediate electrode 7. The intermediate electrode 7 has a shape of a disc and the disc has through holes. A specimen 4 is located on the first electrode 1.

The above mentioned apparatus was previously invented by the inventors of the present invention. The inventors thereafter conducted further studies, and found the facts as will be explained hereinbelow in the specification of this application, thus accomplishing the present invention. Namely, with the apparatus of FIG. 1, the plasma density increases between the first electrode and the intermediate electrode and, hence, a high etching rate is realized even at a low self-bias voltage, and damage due to processing can be reduced. Such effects are greatly dependent upon a gap between the intermediate electrode and the first electrode, and are particularly striking when the gap is small. When, for example, $SiO_2$ is to be processed for contact hole formation, however, a preferential etching of $SiO_2$ to the underlying silicon cannot be performed. As the gap between the intermediate electrode and the first electrode increases, on the other hand, the mode of discharge becomes similar to that of the two electrode type apparatus, whereby the self-bias voltage is increased and the processing causes increased damage. The selectivity of etching to the underlying silicon, however, is increased. According to the conventional apparatus in which the position of the intermediate electrode is fixed, it is not possible to maintain high selectivity while minimizing the damage due to the processing.

The present invention is proposed in order to solve the aforementioned problems inherent in the conventional art.

The above mentioned conventional etching apparatus has been disclosed in Japanese Patent Application No. 111257/78 (Japanese Patent Laid-Open No. 38043/80) that was filed by the inventors of the present invention.

SUMMARY OF THE INVENTION

The principal object of the present invention is to provide a method and apparatus for plasma etching specimens maintaining a high selectivity and etching rate by continuously changing the bias voltage from a high self-bias state to a low self-bias state by varying the gap between the intermediate electrode and the first electrode and by manipulating the RF power, wherein the damaged layer (crystalline lattice disorder) introduced into the specimen during the processing and deposit on the processed surface, are sequentially removed under the condition of a low self-bias voltage, and semiconductor elements having good electrical characteristics can be obtained.

Another object of the present invention is to provide a method and apparatus for plasma etching, which performs a etching with increased stability and good reproducibility.

A further object of the present invention is to provide a method and apparatus for plasma etching, capable of changing the etching rates of the materials to be processed by applying a bias voltage to an intermediate electrode.

According to one aspect of the present invention, there is provided a method for effecting plasma etching of a specimen by using a first and a second electrode and an electrically floated intermediate electrode, placing a specimen on said first electrode and the electrically floated intermediate electrode, applying a high frequency power between said first and second electrode to produce the plasma between said first and second electrode, and carrying out said etching under the condition that the distance between said first and said intermediate electrodes is changed during said etching.

According to another aspect of the present invention, there is provided an apparatus for plasma etching comprising a first electrode, a second electrode, and an electrically floated intermediate electrode which is disposed between said two electrodes, and wherein said apparatus further comprises a drive mechanism which works to vary the distance between the intermediate electrode and the first electrode.

BRIEF DESCRIPTION OF THE DRAWINGS

FIG. 11 is a histogram like that of FIG. 10 but the test pieces being processed according to the method of the present invention;

FIG. 12 is a histogram of breakdown voltages of PN diodes which were processed by a wet chemical etching in the steps of FIGS. 8A to 8D;

FIG. 13 is a histogram of breakdown voltages of PN diodes which were processed by the conventional method in the steps of FIGS. 8A to 8D;

FIG. 14 is a histogram of breakdown voltages of PN diodes which were processed by the method of the present invention in the steps of FIGS. 8A to 8D;

DESCRIPTION OF THE PREFERRED EMBODIMENTS

Figure 1:
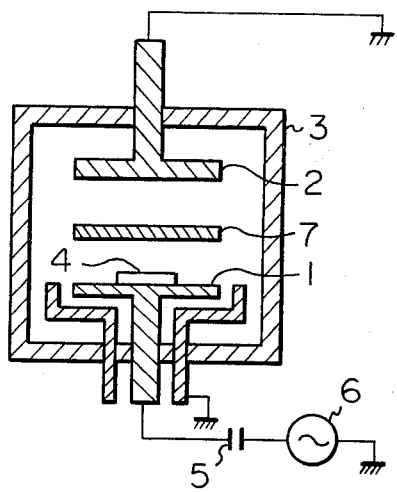
FIG. 1 is a cross-sectional view illustrating the fundamental construction of a conventional apparatus for plasma etching.
Figure 2A:
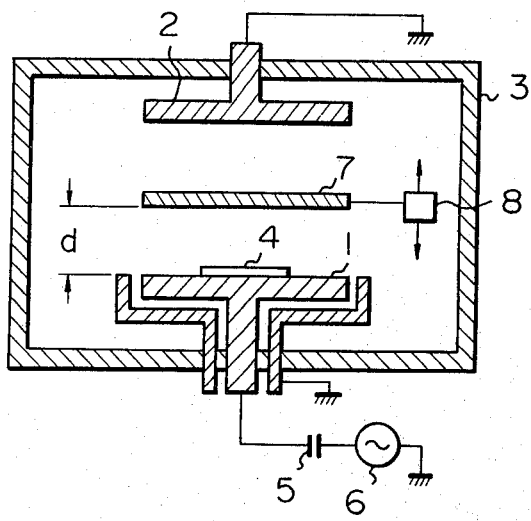
FIG. 2A is a cross-sectional view illustrating the fundamental construction of an apparatus which is employed for a method of plasma etching according to an embodiment of the present invention.
Figure 2B:
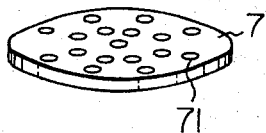
FIG. 2B is a perspective view illustrating an intermediate electrode of the apparatus of FIG. 2A.

FIGS. 2A and 2B are diagrams illustrating an apparatus used for the method of plasma etching according to an embodiment of the present invention. The apparatus for plasma etching comprises a first electrode 1, a second electrode 2, a bell jar 3, a capacitor 5, a high frequency power supply 6, an intermediate electrode 7, and a drive mechanism 8, and subjects the surface of a specimen 4 to etching.

The electric power of a high frequency is applied between the first electrode 1 (cathode in this embodiment) and the second electrode 2 (anode in this embodiment) in the plasma etching apparatus from the high frequency power supply 6 via capacitor 5, and a reactive gas, i.e., an active gas (such as $CHF_3$, $C_2F_6$, $C_3F_8$, $CF_4+H_2$, or the like) or an inert gas (such as argon, xenon, or the like), is introduced into the bell jar 3 of which the interior is maintained at a predetermined gas pressure, so that a plasma discharge occurs between the first and second electrodes. In this case, since there exists the intermediate electrode, the plasma is mostly confined between the first electrode and the intermediate electrode. The intermediate electrode 7 consists of a circular plate having many through holes 71 as illustrated in a perspective view of FIG. 2B. As the plasma discharge occurs, a negative self-bias voltage is generated on the first electrode 1 due to the capacitor 5. Therefore, ions in the plasma are accelerated to subject the surface of the specimen 4 to etching. The energy of ions impinging upon the specimen is determined by the self-bias voltage; the energy increases with the increase in the self-bias voltage. The drive mechanism 8 so works that a distance d between the intermediate electrode 7 and the first electrode 1 can be changed externally of the bell jar 3 side.

Figure 3:
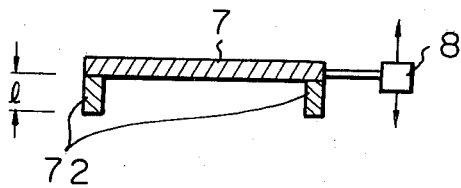
FIGS. 3 and 4 are views of intermediate electrodes according to another embodiment of the present invention.
Figure 4:
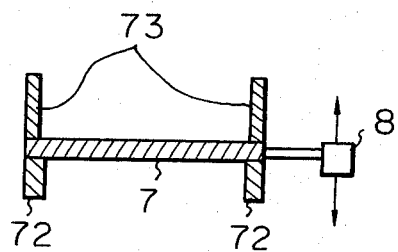
Figure 5:
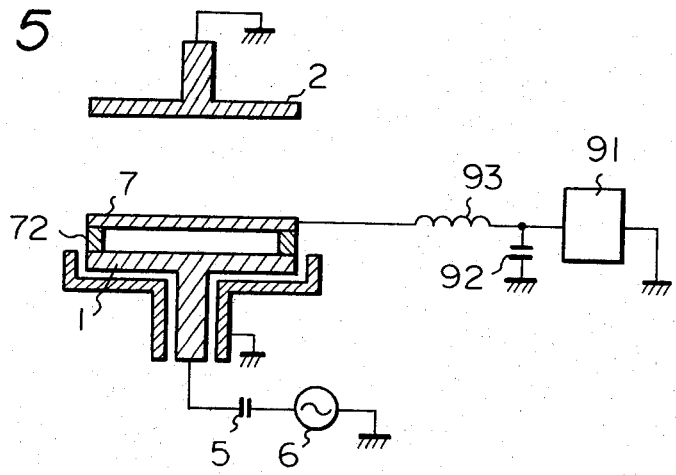
FIG. 5 and FIGS. 6A to 6C are views illustrating specific cases where a d.c. bias voltage is applied to the intermediate electrode of FIG. 2A.

FIGS. 3 to 5 illustrate modified examples of the intermediate electrode of FIGS. 2A and 2B equipped with the drive mechanism. Referring to FIG. 3, the intermediate electrode 7 is equipped with spacers 72 which are made of an insulating material such as $Al_2O_3$ or a material having electric resistance. If the thickness l of the spacer 72 is so set that the intermediate electrode 7 exhibits optimal effects, it is possible to accurately maintain the distance d when the spacers 72 come into contact with the first electrode.

FIG. 4 illustrates the intermediate electrode 7 having electrically conductive support rods 73 on the upper portion thereof. When the intermediate electrode is raised, the support rods come into contact with the second electrode. With the support rods being made of an electrically conductive material, the second electrode becomes electrically conductive to the intermediate electrode. Therefore, the intermediate electrode acts as the second electrode, and the discharge takes place between the intermediate electrode and the first electrode. In this case, the mode of discharge is the same as that of the conventional two electrode type plasma etching apparatuses even when the gap is narrow between the intermediate electrode and the first electrode, and the distance for moving the intermediate electrode can be reduced.

FIG. 5 illustrates an embodiment, in which a voltage is supplied to the intermediate electrode 7 from an external unit to change the processing conditions. The voltage is supplied from an external d.c. power supply 91 to the intermediate electrode 7 via a circuit consisting of an inductor 93 and a capacitor 92.

Figure 6A:
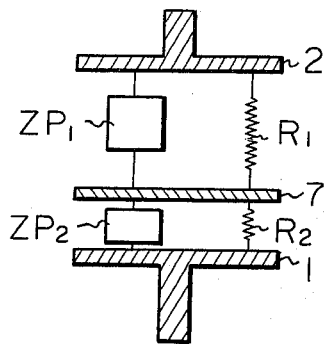
Figure 6B:
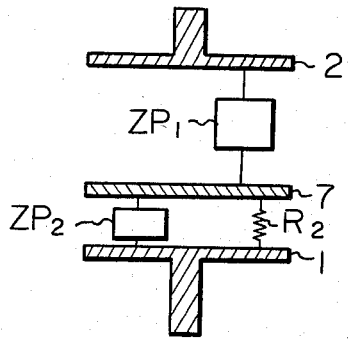
Figure 6C:
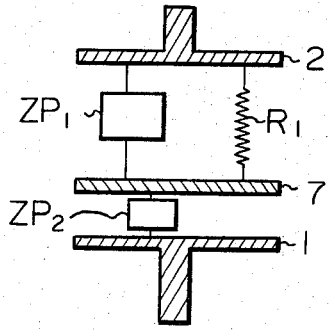

In FIG. 5, the intermediate electrode 7 is served with a voltage from the external power supply. FIGS. 6A to 6C illustrate specific examples in which a d.c. voltage is applied to the intermediate electrode 7 by utilizing a negative self-bias voltage $V_{sb}$ which is induced in the first electrode 1 during the discharge, without utilizing the external power supply. Referring to FIG. 6A, a resistor $R_1$ is connected between the second electrode 2 and the intermediate electrode 7, a resistor $R_2$ is connected between the intermediate electrode 7 and the first electrode 1, and resistances of the resistors are selected to be sufficiently smaller than the impedances $ZP_1$, $ZP_2$ of the plasma ($R_1 << ZP_1$, $R_2 << ZP_2$). The potential $V_{ie}$ of the intermediate electrode 7 is then given by;

$$V_{ie} = R_1/(R_1+R_2)V_{sb} \quad (1)$$

Thus, it is possible to obtain a potential which is determined by the resistances. When the resistances $R_1$, $R_2$ are nearly equal to the plasma impedances $ZP_1$, $ZP_2$, the impedances $ZP_1$, $ZP_2$ are not negligible, and the potential $V_{ie}$ is not given by the equation (1). In this case, however, it is possible to eliminate either one of the resistors $R_1$ or $R_2$ as shown in FIG. 6B or 6C, by utilizing the impedances $ZP_1$ and $ZP_2$.

Below are mentioned the steps for plasma etching according to the present invention.

EXAMPLE 1

Below is mentioned an example in which a silicon semiconductor material having a $SiO_2$ layer of a thickness of 8000 angstroms on the substrate, is subjected to etching.

First, the intermediate electrode 7 having a thickness of 0.5 mm is brought into contact with the second electrode 2 by the up/down drive mechanism 8, or the distance d between the intermediate electrode 7 and the first electrode 1 is maintained to be greater than 48 mm. Then, the silicon dioxide layer is subjected to the etching under the conditions of RF power of 200 watts, $V_{sb}$ of 550 volts, in the presence of $CHF_3$ gas at a pressure of 1.33 Pa (0.01 Torr) for about 25 minutes. Then, over-etching is performed for about 5 minutes to completely remove silicon dioxide (the etching of the first stage).

After the above step has been finished, the intermediate electrode 7 is set to a distance d, which is suitable for exerting the effect of the intermediate electrode, for example, 16 mm by the drive mechanism 8, and the surface is cleaned under the conditions of RF power of 25 watts, $V_{sb}$ of 20 volts, in the presence of $CF_4 + 20\%O_2$ gas at the pressure of 1.33 Pa for 10 minutes (the etching of the second stage). In this case, the silicon surface is etched to a depth of 100 angstroms. This dry-cleaning of the surface removes damage in the processed surface and contamination composed of the polymer film.

After the above cleaning has been carried out, the gap d between the intermediate electrode 7 and the first electrode 1 is reduced to be smaller than 5 mm by the drive mechanism 8. Thus the discharge between the intermediate electrode 7 and the first electrode 1 completely ceases, and the etching is stopped. Experimental results related to a gap between the first electrode and the intermediate electrode are disclosed in the section entitled "Gap between the First Electrode and the Intermediate Electrode" set forth hereinafter.

The above mentioned etching for the $SiO_2$ layer on the silicon semiconductor substrate is employed for forming fine contact holes in such devices as MOS integrated circuits.

Figure 7A:
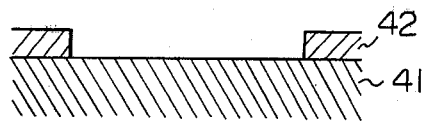
FIGS. 7A to 7C are cross-sectional views illustrating the steps for forming fine contact holes in a semiconductor element according to the method of the present invention.
Figure 7B:
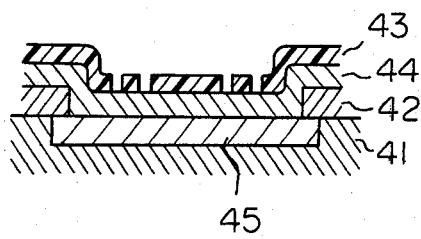
Figure 7C:
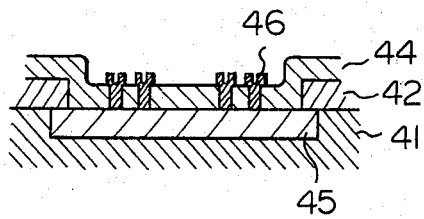

FIGS. 7A to 7C illustrate the steps for forming fine contact holes. First, a silicon dioxide layer 42 is deposited on a silicon substrate 41, and a predetermined portion is removed by etching as shown in FIG. 7A. An arsenic implanted layer 45 is formed in the silicon as shown in FIG. 7B, and onto which is formed a silicon dioxide film 44 or PSG (phosphosilicate glass) by chemical vapor deposition (CVD) method. The film 44 is then subjected to the selective etching in accordance with the method of the present invention through a resist film 43 as shown in FIG. 7B, in order to obtain a CVD $SiO_2$ film 44 as shown in FIG. 7C. Aluminum electrodes 46 are formed in the holes formed in the CVD $SiO_2$ film by the etching.

It is also possible to provide a step of incineration treatment using oxygen plasma in the processing steps of Example 1, in order to incinerate the resist film.

EXAMPLE 2

Below is mentioned an example in which a silicon semiconductor material having an $Si_3N_4$ layer of a thickness of 1000 angstroms on the substrate, is subjected to etching.

First, the $Si_3N_4$ layer is removed by etching which is continued for about 4 minutes under the conditions of using an intermediate electrode of a thickness of 0.5 mm, distance d of 48 mm, RF power of 200 watts, and $V_{sb}$ of 550 volts, in the presence of $CHF_3$ gas at the pressure of 1.33 Pa. The over-etching is further continued for about 1 minute (etching of the first stage).

After the above etching has been finished, the distance d is adjusted to 16 mm by the up/down drive mechanism, and the surface is treated for 10 minutes under the conditions of RF power of 25 watts and $V_{sb}$ of 20 volts in the presence of a $CF_4 + 20\%O_2$ gas at the pressure of 1.33 Pa (etching of the second stage).

After the above treatment is finished, the distance d is reduced to less than 5 mm to discontinue the etching.

Figure 8A:
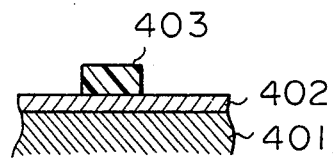
FIGS. 8A to 8D are cross-sectional views illustrating the steps for forming a PN diode by finely processing a $Si_3N_4$ film according to the method of the present invention.
Figure 8B:
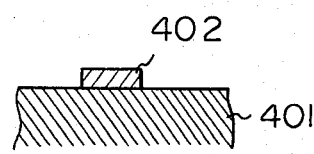
Figure 8C:
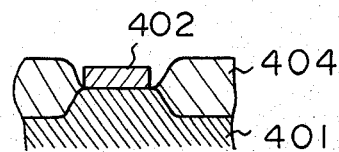
Figure 8D:
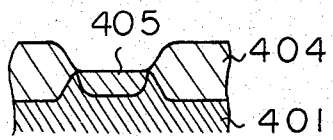

The above mentioned etching for the $Si_3N_4$ layer on the silicon semiconductor substrate is employed for finely processing the $Si_3N_4$ film in the steps of forming PN diodes. FIGS. 8A to 8D illustrate the steps for forming PN diodes. First, an $Si_3N_4$ film 402 on a silicon substrate 401 is processed by the method of the present invention using a resist layer 403 as an etching mask, to obtain the $Si_3N_4$ film 402 as shown in FIG. 8B. Then, an $SiO_2$ film 404 is formed by selective oxidation. After the $Si_3N_4$ film has been removed, arsenic ions are implanted into the silicon substrate, and an arsenic ion implanted layer 405 is formed by heat treatment thereby to obtain a PN diode.

EXAMPLE 3

In this example, a voltage is applied to the intermediate electrode from an external unit. This makes it possible to change the processing conditions, particularly the etching selectivity. The following Table shows etching rates for various materials. As a reactive gas, $CF_4 + 5\%O_2$ gas at a pressure of 1.33 Pa is used, and the etching is performed at an RF power of 100 watts. Numerals in the parentheses represent ratios of the etching rate for silicon.

TABLE

| voltage applied to the intermediate electrode (V) | etching rate (angstroms/min) | | |
|---|---|---|---|
| | $Si_3N_4$ | $SiO_2$ | Si |
| 0 | 460(1.6) | 220(0.8) | 290(1) |
| +100 | 300(1.7) | 120(0.7) | 180(1) |
| −100 | 370(4.1) | 170(1.9) | 90(1) |

When a voltage of +100 volts is applied to the intermediate electrode, the etching rate becomes low for all of the materials. The ratios of the etching rate of $Si_3N_4$ and $SiO_2$ to silicon, however, do not change. When a voltage of −100 volts is applied, on the other hand, the etching rate becomes low, particularly for silicon. Consequently, the ratios of etching rate of $SiO_2/Si$ and $Si_3N_4/Si$ become high. In particular, the ratio of the etching rate of $Si_3N_4/Si$ is increased by 4.1 times. With a usual parallel plate type plasma etching apparatus using $CF_4+5\%O_2$ gas, the ratio of $Si_3N_4$ to silicon is low. The ratio, however, can be increased by using an intermediate electrode and by applying a negative d.c. bias voltage thereto.

Gap between the First Electrode and the Intermediate Electrode

Figure 15:
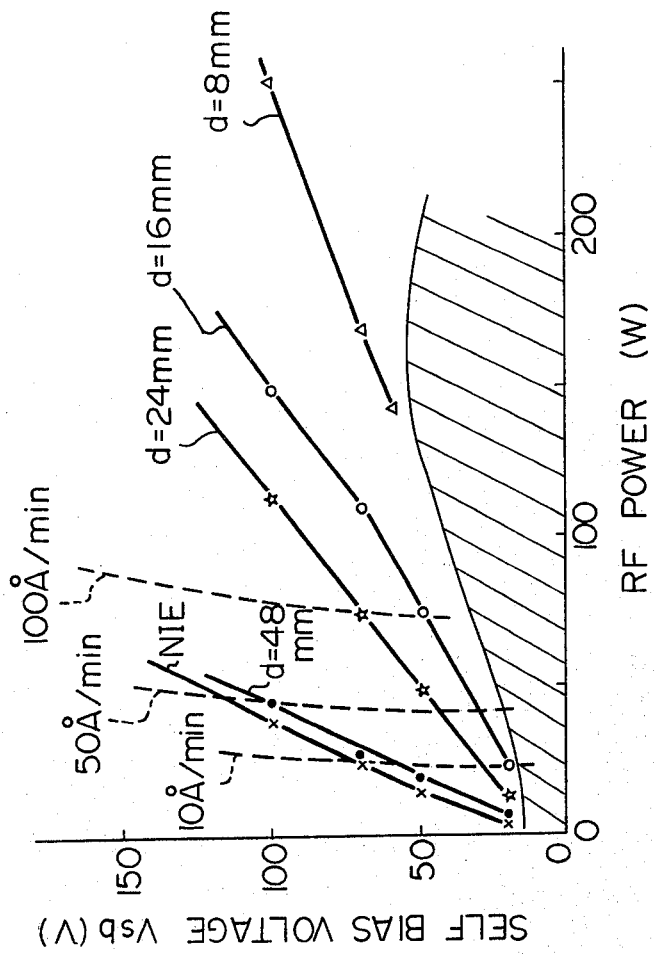
FIG. 15 is a diagram illustrating relations between the RF power and the self-bias voltage in the apparatus of FIG. 2A.

FIG. 15 illustrates a relation between the RF power and the self-bias voltage in the parallel plate type plasma etching apparatus having an intermediate electrode. In this case, the reactive gas is $CF_4+20\%O_2$ gas at a pressure of 1.33 Pa (0.01 Torr).

In FIG. 15, symbol d denotes the distance between the intermediate electrode and the first electrode. The intermediate electrode has a thickness of 0.5 mm. Under the condition that the values of RF powers are the same, the self-bias voltage $V_{sb}$ can be reduced in the case where an intermediate electrode is provided, the smaller the distance d is, the greater the effects are. The curve indicated as NIE represents the case when there is no intermediate electrode. The broken curves indicated as 10 Å/min, 50 Å/min and 100 Å/min denote lines on which the etching rates for silicon are 10 Å/min, 50 Å/min, and 100 Å/min, respectively. According to FIG. 15, the self-bias voltage $V_{sb}$ can be reduced at the same RF power without decreasing the etching rate for silicon.

Figure 16:
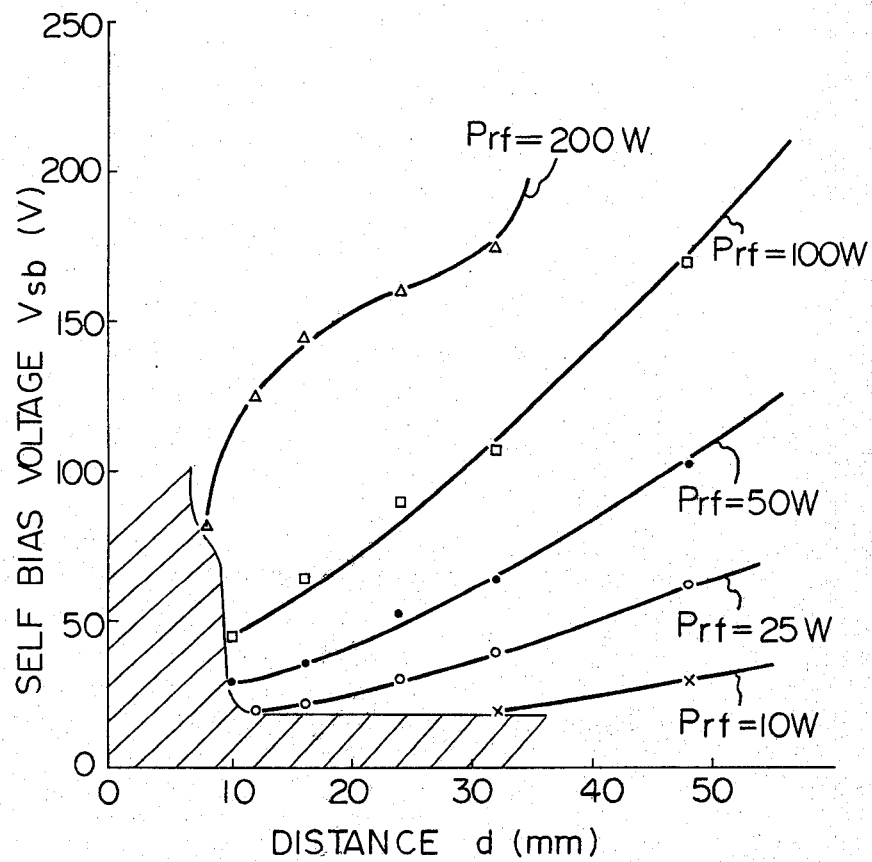
FIG. 16 is a diagram illustrating relations between the self-bias voltage and the gap between the intermediate electrode and the first electrode of the apparatus of FIG. 2A with the RF power as a parameter.

FIG. 16 illustrates the dependency of the self-bias voltage $V_{sb}$ upon the distance between the intermediate electrode and the first electrode with the RF power $(P_{rf})$ as a parameter. As the distance is reduced, the self-bias voltage $V_{sb}$ is reduced under all of the RF power conditions. When the distance is extremely reduced, however, the discharge becomes unstable or is interrupted between the intermediate electrode and the first electrode. Hatched areas in FIGS. 15 and 16 represent the regions where the discharge becomes unstable between the intermediate electrode and the first electrode, where the discharge is interrupted, or where the discharge takes place between the intermediate electrode and the second electrode but does not take place between the intermediate electrode and the first electrode. This is attributed to the development of dark space in which an intense electric field is concentrated near the first electrode in the plasma. In this case, if the intermediate electrode is brought too close to the first electrode, the intermediate electrode is connected to the first electrode presumably through the dark space.

Contamination and Lattice Defect on the silicon surface

Figure 17:
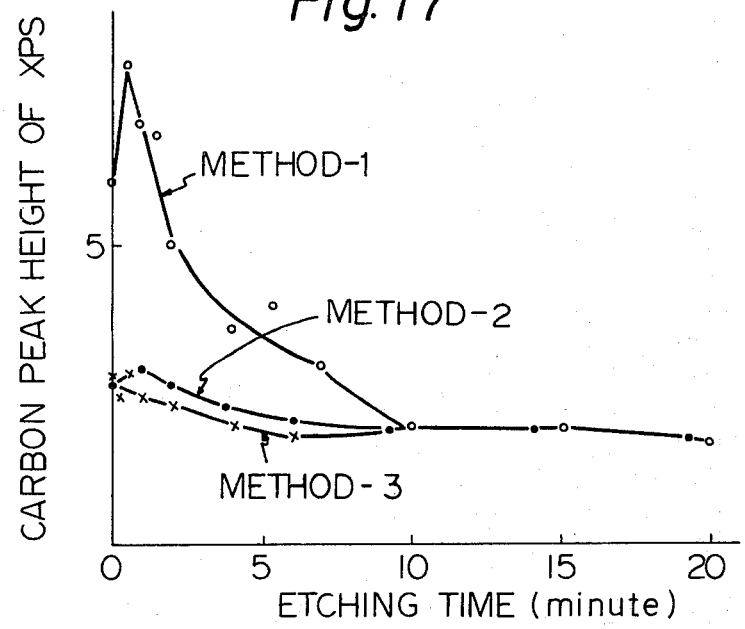
FIG. 17 is a diagram showing the depth profile of carbon from the surface of the silicon substrate processed by each of three processing methods.
Figure 18:
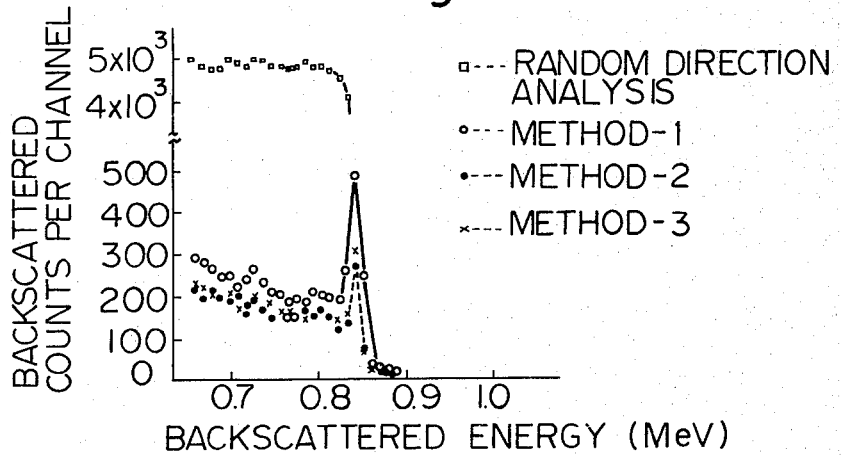
FIG. 18 is a diagram illustrating the lattice defects in the silicon substrate processed by each of the processing methods, as analyzed by the He+ Rutherford back-scattering method.

FIGS. 17 and 18 illustrate the results of the two stage processes of the aforementioned Examples 1 and 2. Namely, FIG. 17 shows the contamination on the silicon surface after the CVD $SiO_2$ film and $Si_3N_4$ film have been etched, which is measured by X-ray photoelectron spectroscopy (XPS). A polymer film composed of carbon and fluorine is formed on the surface of the silicon after the CVD $SiO_2$ film or $Si_3N_4$ film is etched by the first stage etching. FIG. 17 illustrates the depth profile of carbon from the surface of the silicon, in which the abscissa represents the etching time (minutes) by argon ions ($Ar^+$) during the XPS analysis, and the ordinate represents the peak height (arbitrary unit) of carbon.

METHOD-1 represents the data of XPS analysis which is carried out after the CVD $SiO_2$ film is subjected to the first stage etching. METHOD-2 represents the data obtained from the specimen which is subjected to the second stage etching for 10 minutes using the apparatus having the intermediate electrode after the first stage etching has been performed in accordance with the present invention, and METHOD-3 represents the data obtained from the specimen which is etched by wet chemical etching.

According to FIG. 17, large amounts of carbon are deposited on the silicon surface when the CVD $SiO_2$ film is subjected to the first stage etching, as compared with the wet etching method. However, when the silicon substrate is subjected to the second stage etching after the first stage etching using the apparatus having an intermediate electrode, the peak height of carbon is decreased to the same level as that in METHOD-3.

FIG. 18 illustrates the results of the surface analysis using the $He^+$ Rutherford backscattering method for comparing the lattice defect of crystals induced by the plasma etching. Processing conditions of the designated METHOD-1 to METHOD-3 are the same as those of the aforementioned XPS methods 1, 2, and 3. Small squares represent analytical results from random directions, which are reference values of the Rutherford backscattering method. According to this method, at a backscattered energy of about 0.84 MeV in the backscattering spectra, 500 counts of surface peak is measured after the CVD $SiO_2$ has been subjected to the first stage etching compared to 300 counts in the wet chemical etching, and this indicates the presence of a lattice defect of silicon near the surface due to processing at a high self-bias voltage $V_{sb}$. Through the etching of the second stage, however, the surface peak becomes nearly equal to that of the wet etching, which means that the lattice defect is removed. In FIG. 18, the abscissa represents the backscattered energy (MeV) and the ordinate represents the backscattered counts per channel.

Contact Resistance

Figure 9A:
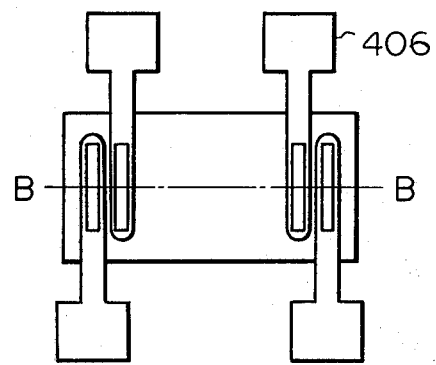
FIG. 9A is a plan view illustrating the construction of a test piece for comparing the contact resistances of contact holes processed by a conventional method and the method of the present invention.
Figure 9B:
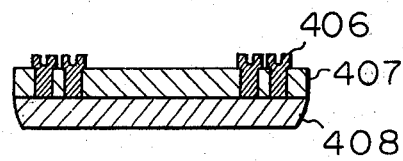
FIG. 9B is a cross-sectional view along the line B—B of FIG. 9A.

FIGS. 9A and 9B illustrate the construction of a test piece for measuring the contact resistance of the contact holes which are processed by the conventional etching method and the method of the present invention. FIG. 9A is a plan view of the test piece, and FIG. 9B is a cross-sectional view along the line B—B of FIG. 9A. The size of the contact hole is $33 \times 3$ $m^2$. The test piece consists of aluminum electrodes 406, an $SiO_2$ layer 407, and an arsenic implanted layer 408.

Figure 10:
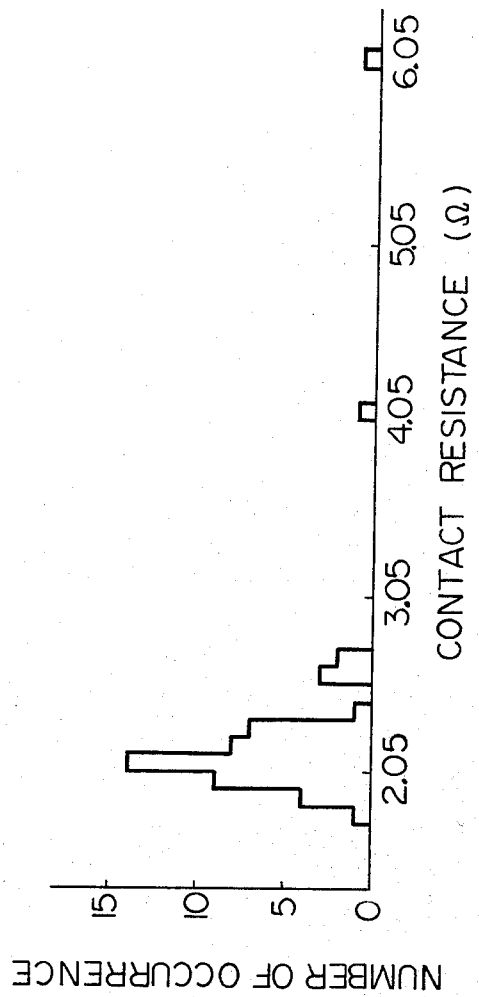
FIG. 10 is a histogram of contact resistances of the test pieces of FIG. 9A processed according to the conventional method.

FIG. 10 is a histogram of contact resistance of the contact holes which are formed according to the conventional method, i.e., by the etching of the first stage only. Namely, the contact hole is formed by dry processing using CHF$_3$ as the reactive gas at a self-bias voltage V$_{sb}$ of 550 volts.

FIG. 11 is a histogram of contact resistance of the contact holes which are formed according to the method of the present invention. In this case, the SiO$_2$ film of a thickness of 8000 angstroms is subjected to etching for about 25 minutes under the conditions of a thickness of the intermediate electrode of 0.5 mm, distance d of 48 mm, RF power of 200 watts, self-bias voltage V$_{sb}$ of 550 volts, using a CHF$_3$ gas at a pressure of 1.33 Pa, followed by over-etching for about 5 minutes. It is further subjected to etching for 10 minutes by adjusting the distance d to 16 mm, using CF$_4$+20%O$_2$ gas at a pressure of 1.33 Pa under the conditions of RF power of 25 watts and the self-bias voltage of 20 volts. Comparison of FIG. 10 with FIG. 11 indicates that when the etching of the second stage is performed by adjusting the distance d to 16 mm as contemplated by the present invention, variance in the contact resistance is reduced and the contact resistance is decreased.

Reverse characteristics of PN Junction

FIGS. 12 to 14 are histograms of breakdown voltages of PN diodes which are formed by finely processing the Si$_3$N$_4$ film. FIG. 12 represents the result in which PN diodes were processed by the wet chemical etching using hot phosphoric acid. FIG. 13 is a histogram of breakdown voltages of PN diodes which were fabricated by the conventional method without the etching of the second stage. FIG. 14 represents the result obtained by the fabrication process in which the Si$_3$N$_4$ film of a thickness of 1000 angstroms on the silicon substrate is subjected to plasma etching of the first stage for about 4 minutes in accordance with the method of the present invention under the conditions of a thickness of the intermediate electrode of 0.5 mm, distance d of 48 mm, RF power of 200 watts, and self-bias voltage V$_{sb}$ of 550 volts, using a CHF$_3$ gas at a pressure of 1.33 Pa, followed by over-etching for about 1 minute and then is further subjected to the etching of the second stage by adjusting the distance d to 16 mm, using CF$_4$+20%O$_2$ gas at a pressure of 1.33 Pa under the conditions of RF power of 25 watts and V$_{sb}$ of 20 volts. The breakdown voltage of any PN diode processed according to the method of the present invention is greater than 30 volts, unlike that processed by wet etching.

Experiments using Gate-Controlled Diode

The effects of the present invention were investigated in detail by the inventors using a gate-controlled diode, similar to the case of the above described PN diode.

Figure 19:
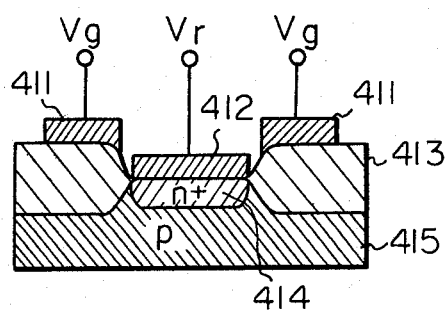
FIG. 19 is a cross-sectional view illustrating the construction of a gate-controlled diode which is used as a test device for measuring electrical characteristics of the specimens processed by each of the processing methods.

FIG. 19 illustrates the construction of the gate-controlled diode. A gate voltage V$_g$ and a reverse voltage V$_r$ are applied to aluminum electrodes 411 and 412, respectively. Aluminum electrode 411 as a gate electrode is located on an SiO$_2$ film 413 and arsenic ions are implanted into a p-type silicon substrate 415 and the specimen is annealed to form an n-type arsenic implanted layer 414.

Figure 20:
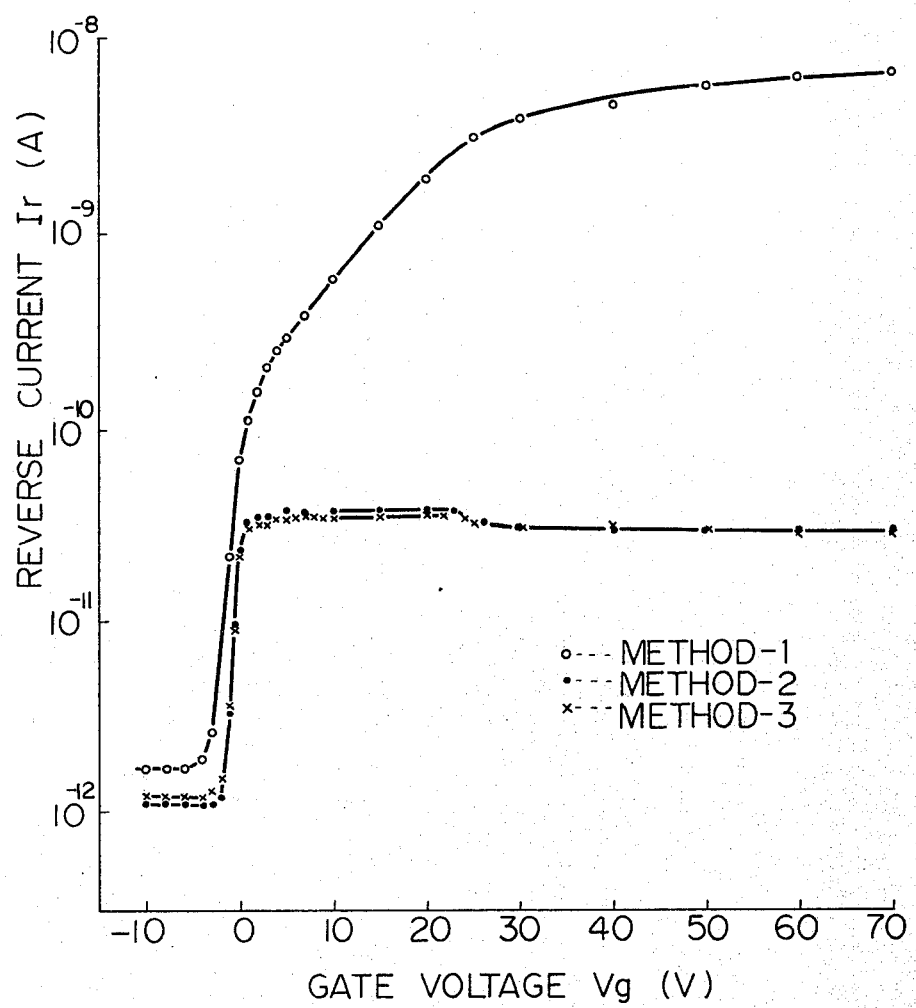
FIG. 20 is a diagram illustrating the reverse currents of a gate-controlled diode processed by each of the processing methods.

FIG. 20 illustrates the relation between the gate voltage V$_g$ and the reverse current I$_r$ of the gate-controlled diode. In this case, the reverse voltage V$_r$ is 15 volts. In FIG. 20, METHOD-1 represents the characteristic of the gate controlled diode fabricated by the process in which the Si$_3$N$_4$ film on the silicon substrate is subjected to etching of the first stage only. METHOD-2 represents the result obtained by the process in which the etching of the second stage is effected for 10 minutes at a low self-bias voltage according to the method of the present invention. METHOD-3 represents the result of the diode which is fabricated by the wet etching method. The effect of the method according to the present invention is comparable to that in the conventional wet chemical etching. With the etching of the first stage only, however, reverse current I$_r$ is increased. This is presumably due to the presence of a lattice defect and polymer film on the processed surface, which acts as the generation-recombination (g-r) center.

According to the present invention as mentioned above, the etching of the second stage gives distinguished effects without causing damage to the specimen being processed like the wet chemical etching, or without deposits on the processed surfaces.

Experiments related to the Thickness of the Intermediate Electrode

The aforementioned embodiments of FIGS. 2A to 6C did not particularly deal with the thickness of the intermediate electrode. According to the study conducted by the inventors of the present invention, however, it was determined that the thickness of the intermediate electrode affects the stability of the discharge. Below are mentioned relations of various conditions such as RF power relative to the self-bias voltage V$_{sb}$.

Figure 21:
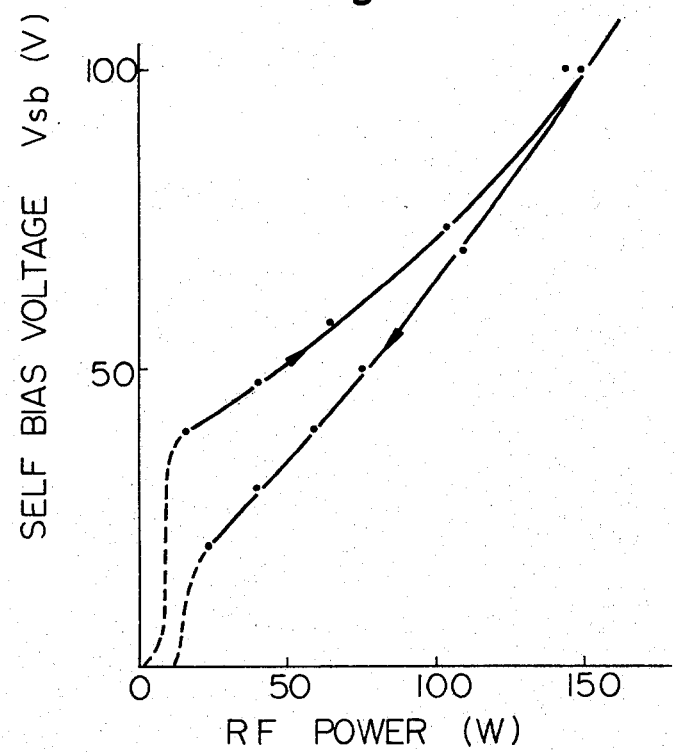
FIG. 21 is a diagram showing the relation between the RF power and the self-bias voltage when the intermediate electrode in the apparatus of FIG. 2A has a thickness of 4 mm.

FIG. 21 illustrates a relation between the RF power and the self-bias voltage V$_{sb}$ in case of the intermediate electrode with a thickness of 4 mm. The distance between the intermediate electrode and the first electrode is 16 mm. There is a difference between the state where the discharge is being initiated and the state where the discharge is stably sustained when the self-bias voltage V$_{sb}$ is lower than 100 volts. Such phenomenon, however, is not observed when the intermediate electrode has a thickness of 0.5 mm.

Figure 22:
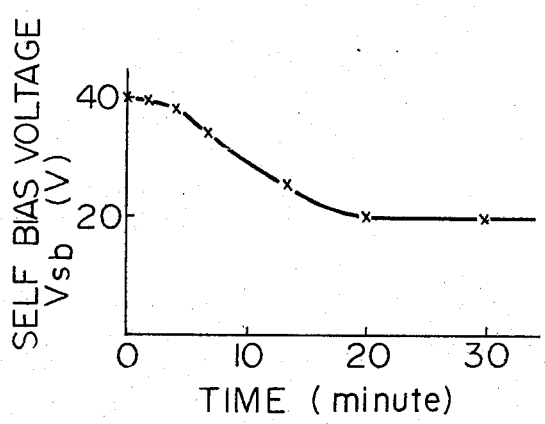
FIG. 22 is a diagram illustrating the change of the self-bias voltage in the apparatus of FIG. 2A with respect to the passage of time.

FIG. 22 illustrates the change of V$_{sb}$ with the passage of time when the discharge is maintained at an RF power of 25 watts. The distance is 16 mm between the intermediate electrode and the first electrode. The self-bias voltage V$_{sb}$ is high when the discharge is initiated; about 20 minutes are required for assuming a stable V$_{sb}$. Under such conditions, the V$_{sb}$ undergoes the change while the specimen is being processed, and it is difficult to obtain a predetermined etching rate maintaining good reproducibility. The thickness of the intermediate electrode, in this case, is 4 mm.

Figure 23:
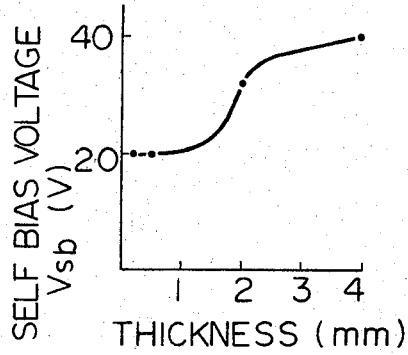
FIG. 23 is a diagram illustrating the dependency of the self-bias voltage in the apparatus of FIG. 2A upon the thickness of the intermediate electrode when the discharge is being initiated.

FIG. 23 illustrates the dependency of V$_{sb}$ upon the thickness of the intermediate electrode when the discharge is initiated. The RF power is 25 watts, and the distance is 16 mm between the intermediate electrode and the first electrode. As the thickness of the intermediate electrode becomes greater, the self-bias voltage V$_{sb}$ in the beginning of the discharge relative to V$_{sb}$ under stable conditions become higher. When the thickness is reduced to less than 2 mm, the V$_{sb}$ in the beginning of the discharge becomes equal to the V$_{sb}$ under stable conditions. Consequently, it is recommended to reduce the thickness of the intermediate electrode to less than 2 mm.

We claim:

1. A method for effecting plasma etching of a semiconductor material comprising the steps of: providing a first and a second electrode and an electrically floating intermediate electrode, placing a semiconductor material on said first electrode and said electrically floated intermediate electrode, applying a high frequency power between said first and second electrode to produce a plasma between said first and second electrode, and etching the semiconductor material under the condition that the distance between said first and said intermediate electrode is changed during said etching.

2. A method as set forth in claim 1, wherein the semiconductor material is processed under the conditions of a high input power and a high self-bias voltage while maintaining a predetermined distance between the intermediate electrode and the first electrode, then said distance is reduced to be smaller than said predetermined distance, and the semiconductor material is further processed under the conditions of a low input power and a low self-bias voltage.

3. A method as set forth in claim 1 or 2, wherein the semiconductor material is subjected to the etching while continuously changing the distance between said intermediate electrode and said first electrode.

4. A method as set forth in claim 1 or 2, wherein a voltage from an external source is applied to said intermediate electrode.

5. A method as set forth in claim 1 or 2, wherein the distance between said intermediate electrode and said first electrode is set to a predetermined length, said high frequency power is set to a predetermined value, and wherein the semiconductor material is subjected to a first etching using a first reactive gas, the distance between said intermediate electrode and said first electrode is then reduced to be smaller than said predetermined length, the high frequency power is set to a value which is smaller than said predetermined value, and the semiconductor material is subjected to an additional etching using a second reactive gas.

6. A method as set forth in claim 5, wherein the semiconductor material comprises a substrate and a $SiO_2$ layer and wherein in the first etching the $SiO_2$ layer is removed using a first reactive gas selected from $CHF_3$, $C_2F_6$, $C_3F_8$, and $CF_4+H_2$, and in the additional etching the second reactive gas is $CF_4+O_2$.

7. A method as set forth in claim 5, wherein the semiconductor material comprises a substrate and a $Si_3N_4$ layer and wherein in the first etching the $Si_3N_4$ layer is removed using a first reactive gas selected from $CHF_3$, $C_2F_6$, $C_3F_8$, and $CF_4+H_2$, and in the additional etching the second reactive gas is $CF_4+O_2$.

8. The method of claim 6 or 7, wherein the pedetermined distance between the intermediate electrode and the first electrode in the initial etching is set at approximately 48 mm. or more.

9. The method of claim 6 or 7, wherein the thickness of the intermediate electrode is less than 2 mm.

10. The method of claim 8, wherein the thickness of the intermediate electrode is less than 2 mm.

11. An apparatus for plasma etching comprising a first electrode, a second electrode, an electrically floated intermediate electrode positioned between said two electrodes, and a drive mechanism for varying the distance between said intermediate electrode and said first electrode.

12. An apparatus for plasma etching as set forth in claim 11, wherein the thickness of said intermediate electrode is smaller than 2 mm.

13. The apparatus of claim 11, wherein said intermediate electrode has spacers formed of an insulating material, facing the first electrode, and with a thickness for maintaining a predetermined distance between the first and intermediate electrodes.

14. The apparatus of claim 11 or 13, wherein said intermediate electrode has electrically conductive support rods facing the second electrode, wherein the second electrode becomes electrically conductive to the intermediate electrode when the support rods contact the second electrode.

15. The apparatus of claim 11, further comprising a housing for containing said first, second, and intermediate electrodes and introducing an etching plasma therein.

16. The apparatus of claim 15, further comprising means external of said housing for supplying a voltage to the intermediate electrode.

17. The apparatus of claim 15, further comprising means internal of said housing for supplying a voltage to the intermediate electrode.

18. The apparatus of claim 17, wherein said internal voltage supplying means comprises at least one resistor connected between the intermediate and first electrodes or between the intermediate and second electrodes.

* * * * *

UNITED STATES PATENT AND TRADEMARK OFFICE
CERTIFICATE OF CORRECTION

PATENT NO. : 4,349,409

DATED : September 14, 1982

INVENTOR(S) : Shibayama et al.

It is certified that error appears in the above-identified patent and that said Letters Patent is hereby corrected as shown below:

Front page, [57] ABSTRACT, line 4, "state" should be --plate--.

Col. 1, line 34, "speed.  There" should be --speed, there--.

Col. 2, line 31, "a" should be --an--.
line 42, delete "and the electrically";
line 43, delete "floated intermediate electrode".

Col. 4, line 38, delete "side".

Col. 10, line 59, "become" should be --becomes--.

Signed and Sealed this

Twenty-fifth Day of June 1985

[SEAL]

Attest:

DONALD J. QUIGG

Attesting Officer    Acting Commissioner of Patents and Trademarks

UNITED STATES PATENT AND TRADEMARK OFFICE
CERTIFICATE OF CORRECTION

PATENT NO. : 4,349,409

DATED : September 14, 1982

INVENTOR(S) : Shibayama et al.

It is certified that error appears in the above-identified patent and that said Letters Patent is hereby corrected as shown below:

Column 11, line 2, delete "and said electrically floated";
line 3, delete "intermediate electrode".

Signed and Sealed this

Fourth Day of February 1986

[SEAL]

Attest:

DONALD J. QUIGG

Attesting Officer

Commissioner of Patents and Trademarks